United States Patent
Stief et al.

(10) Patent No.: US 6,639,861 B2
(45) Date of Patent: Oct. 28, 2003

(54) INTEGRATED MEMORY AND METHOD FOR TESTING AN INTEGRATED MEMORY

(75) Inventors: Reidar Stief, München (DE); Peter Beer, Tutzing (DE); Herbert Benzinger, München (DE); Stephan Schroeder, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/125,089

(22) Filed: Apr. 18, 2002

(65) Prior Publication Data

US 2002/0154560 A1 Oct. 24, 2002

(30) Foreign Application Priority Data

Apr. 18, 2001 (DE) .......................... 101 19 052

(51) Int. Cl.[7] .................................. G11C 7/00
(52) U.S. Cl. .................. 365/201; 365/207; 365/208
(58) Field of Search ................. 365/201, 207, 365/208

(56) References Cited

U.S. PATENT DOCUMENTS 5,894,445 A * 4/1999 Kobayashi .................. 365/208
6,118,713 A * 9/2000 Raad .......................... 365/201

FOREIGN PATENT DOCUMENTS

JP         06 176 600 A      6/1994

* cited by examiner

Primary Examiner—Van Thu Nguyen
(74) Attorney, Agent, or Firm—Laurence A. Greenberg; Werner H. Stemer; Ralph E. Locher

(57) ABSTRACT

An integrated memory has a memory cell array containing word lines and bit lines. The bit lines, for reading out a data signal, can in each case be connected to a sense amplifier via a controllable switching device. Furthermore, a control circuit is contained, having an output, which is connected to a control input of the respective switching device, and having an input, which is connected to a terminal for a test mode signal. The control circuit is configured in such a way that, within an access cycle, the respective switching device can be switched into a non-conducting state on account of an active state of the test mode signal. In the integrated memory, it is possible to measure the leakage behavior of a bit line during the read-out of a data signal.

7 Claims, 1 Drawing Sheet

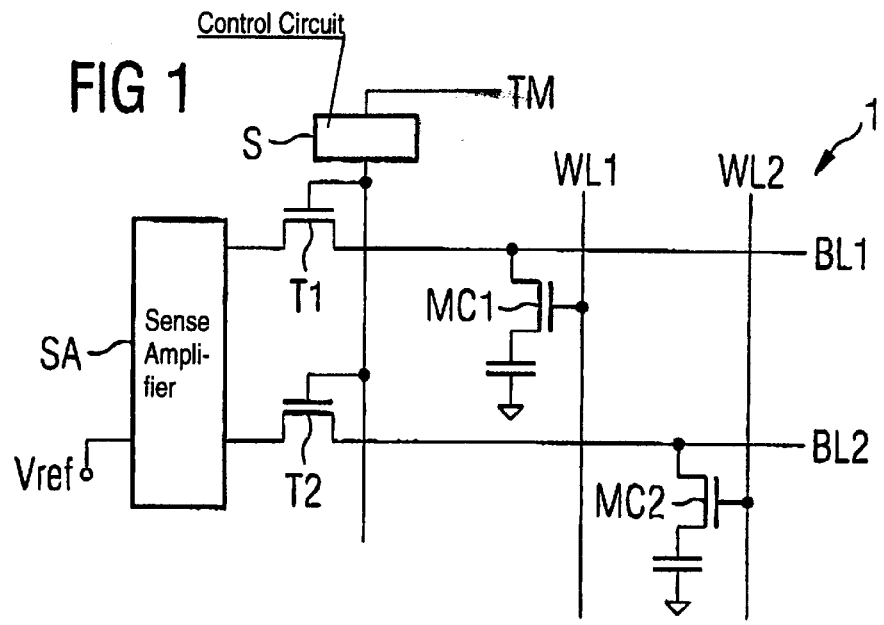
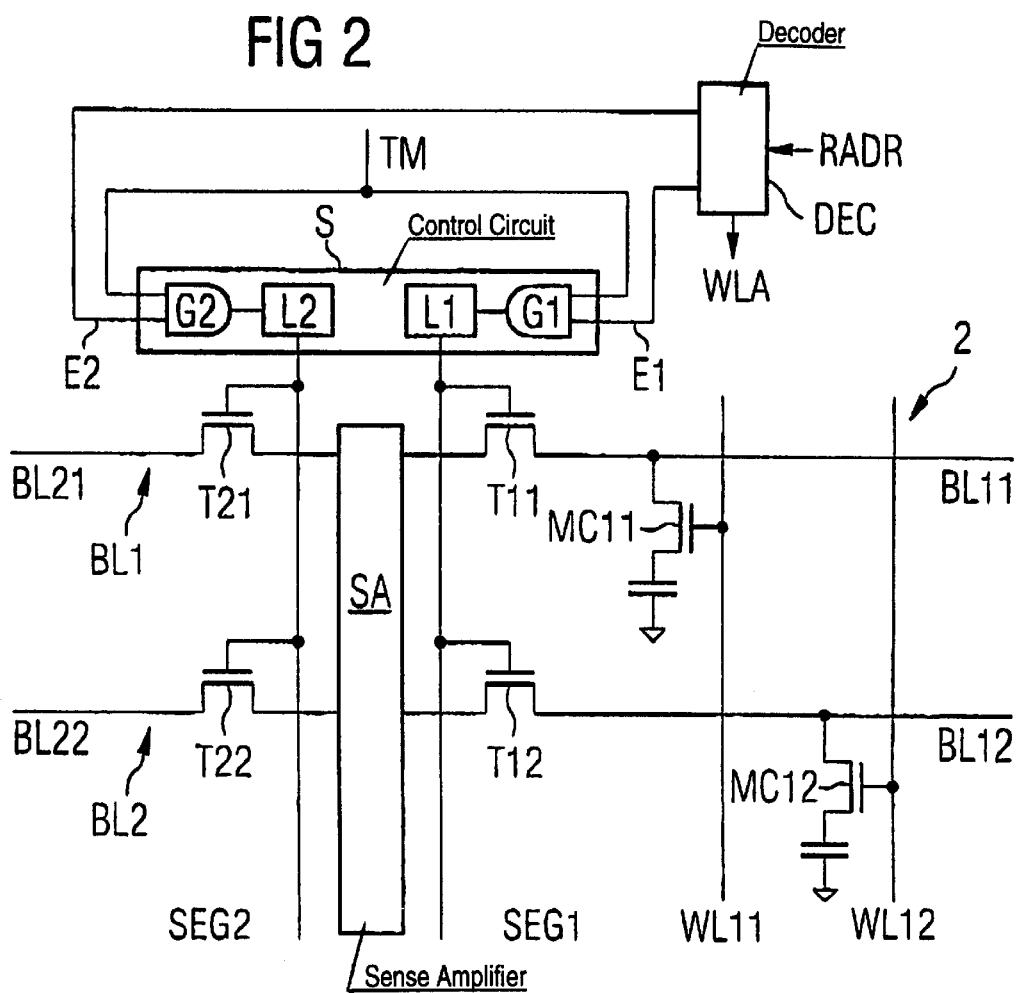

INTEGRATED MEMORY AND METHOD FOR TESTING AN INTEGRATED MEMORY

BACKGROUND OF THE INVENTION

Field of the Invention

The present invention relates to an integrated memory having a memory cell array, which has word lines for the selection of memory cells and bit lines for reading out or writing data signals from/to the memory cells. The bit lines, for reading out a data signal, can in each case be connected to a sense amplifier via a controllable switching device. The invention also relates to a method for testing an integrated memory of this type.

An integrated memory such as, for example, a memory of the DRAM type generally has one or more memory cell arrays each containing bit lines and word lines. The memory cells are disposed at crossover points between the bit lines and word lines. For the selection of the memory cells, selection transistors of respective memory cells are turned on by an activated word line, as a result of which a data signal of a selected memory cell can subsequently be read out or written. To that end, the selected memory cell is connected via the selection transistor to one of the bit lines, via which the respective data signal is read out or written in. The information read out from a memory cell in the event of a memory cell access is evaluated and amplified by a sense amplifier.

A memory cell array of an integrated memory is often subdivided into a plurality of segments which each adjoin one another. In this case, the bit lines run through each of the segments. Consequently, in the case of two memory segments, a bit line half of the respective bit line is disposed in each of the segments. In particular in the interests of a space-saving configuration, there is usually disposed between two segments in each case a sense amplifier which is assigned jointly to both segments and can be connected to the bit line halves of the respective bit line via a respective switching device.

In a deactivation state or precharge state, generally both bit line halves of the respective bit line are connected to the sense amplifier. For a memory cell access, the cell information of the selected memory cell passes first onto the bit line half connected to the memory cell and thus to the sense amplifier. The respective other bit line half of the selected bit line is disconnected from the sense amplifier via the corresponding switching device. This ensures that only one of the bit line halves is connected to the sense amplifier. Consequently, in each state of the bit line, at least one bit line half is connected to the sense amplifier. In this case, within an access cycle for reading out a data signal via a selected bit line, it is generally not possible, however, for both bit line halves connected to the sense amplifier to be simultaneously disconnected from the sense amplifier. Therefore, it is not possible to measure, for example, the leakage behavior of a bit line half to be read.

SUMMARY OF THE INVENTION

It is accordingly an object of the invention to provide an integrated memory and a method for testing an integrated memory which overcome the above-mentioned disadvantages of the prior art devices and methods of this general type, in which it is possible to measure the leakage behavior of a bit line.

With the foregoing and other objects in view there is provided, in accordance with the invention, an integrated memory. The memory contains a sense amplifier, a terminal for a test mode signal, and controllable switching devices connected to the sense amplifier and having control inputs. A memory cell array is provided and has memory cells, word lines connected to and selecting the memory cells, and bit lines connected to the memory cells for reading out or writing data signals to/from the memory cells. The bit lines are connected to the controllable switching devices and, for reading out a data signal, the bit lines in each case are coupled to the sense amplifier through one of the controllable switching devices. A control circuit having an output is connected to the control inputs of the controllable switching devices. The control circuit has an input connected to the terminal for the test mode signal. The control circuit is configured in such a way that, within an access cycle, a respective switching device of the controllable switching devices can be switched into a non-conducting state on account of an active state of the test mode signal.

The object relating to the integrated memory is achieved by an integrated memory of the type mentioned in the introduction having a control circuit with an output. The output is connected to a control input of the respective switching device. The control circuit has an input, which is connected to a terminal for a test mode signal in which the control circuit is configured in such a way that, within an access cycle, the respective switching device an be switched into a non-conducting state on account of an active state of the test mode signal.

The present integrated memory according to the invention makes it possible to measure the leakage behavior of a bit line when a data signal is read out via the relevant bit line, to be precise without the influence of the sense amplifier. For this purpose, use is made of a corresponding control circuit that, on account of an active state of the test mode signal, puts the respective switching device into the non-conducting state within an access cycle. As a result, the relevant bit line is no longer connected to the sense amplifier and the leakage behavior of the bit line can be measured without the influence of the sense amplifier.

In one embodiment of the method according to the invention, the bit lines are in each case disposed in at least two mutually adjoining segments of the memory cell array, so that a bit line half of the respective bit line is disposed in each of the segments. The sense amplifier is disposed between the two segments and can be connected to the bit line halves of the respective bit line via a respective switching device.

In a further embodiment, in a deactivation state, the bit line halves of the respective bit line are connected to the sense amplifier. In the event of a memory cell access, one of the bit line halves of the selected bit line is connected to the sense amplifier, and the respective other of the bit line halves of the selected bit line is disconnected from the sense amplifier. That one of the bit line halves which is connected to the sense amplifier can be disconnected from the sense amplifier on account of the active state of the test mode signal.

This affords the advantage, in particular, that one bit line half can be disconnected independently of the other bit line half of the same bit line. Since the relevant bit line half via which the data signal is read out is no longer driven, the read-out signals can develop independently of the sense amplifier. If a leakage mechanism is present, then there is a change in the relevant potential state on the corresponding bit line half. This change in the potential state can subsequently be measured.

In accordance with an added feature the invention, a decoder circuit is provided and receives address signals for selecting one of the memory cells. The control circuit has a further input connected to the decoder circuit.

In accordance with a further feature of the invention, the decoder circuit is a word line decoder to which a word line address for selecting one of the word lines can be applied.

The object relating to the method is achieved by a method for testing an integrated memory according to the invention in which one of the memory cells is selected for reading out a stored data signal by the activation of one of the word lines. The data signal to be read out on a selected bit line is evaluated and amplified by the sense amplifier, in which afterward the test mode signal is activated for the purpose of disconnecting the selected bit line from the sense amplifier. A potential state of the selected bit line is written back to the memory cell after the disconnection, and in which the memory cell is selected again after the writing-back process. The potential state written back to the memory cell is evaluated by the sense amplifier.

The method according to the invention makes it possible to measure the leakage behavior of a bit line when a data signal is read out, without the influence of the sense amplifier. A potential state of the bit line which is altered after the disconnection of the bit line to be read and thus the leakage behavior of the bit line can be measured after the disconnection by the potential state that is established being written back to the relevant memory cell. After a fixedly set or externally definable time, which can be set by way of the test mode signal, for example, the word line for the selection of the relevant memory cell is deactivated. By reading out the written-back potential state via the sense amplifier, it is possible to infer the leakage behavior of the bit line.

In order to obtain a correspondingly accurate resolution of the measurement result, in one embodiment of the method according to the invention, the reference potential of the sense amplifier is altered for the purpose of the evaluation of the written-back potential state relative to the previous read-out of the data signal. As a result, it is possible to alter the sensitivity of the sense amplifier in order, for example, that the evaluation of the written-back potential state is made more critical.

Other features which are considered as characteristic for the invention are set forth in the appended claims.

Although the invention is illustrated and described herein as embodied in an integrated memory and a method for testing an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block circuit diagram of a first embodiment of an integrated memory according to the invention; and FIG. 2 is a block circuit diagram of a second embodiment of the integrated memory according to the invention, whose memory cell array has a plurality of segments.

DESCRIPTION OF THE PREFERRED EMBODIMENTS

Referring now to the figures of the drawing in detail and first, particularly, to FIG. 1 thereof, there is shown a memory cell array 1 of an integrated memory which has word lines WL1 and WL2 and bit lines BL1 and BL2. Memory cells MC1 and MC2 are disposed at crossover points between the word lines WL1, WL2 and the bit lines BL1, BL2. The memory cells are selected via a respective word line for a read or write operation. To that end, the word lines are connected to a respective activation potential, so that the connected selection transistors are turned on. Via the bit lines, a data signal is read from the memory cells or written to one of the memory cells. The bit lines BL1, BL2 are connected to a sense amplifier SA for this purpose. After the read or write operation, the bit lines BL1, BL2 are deactivated, that is to say brought to a deactivation potential in the form of a reference-ground potential, for example.

The bit lines BL1, BL2 can be connected to the sense amplifier SA via respective controllable switches T1 and T2. An output of a control circuit S is connected to the respective control inputs of the switches T1 and T2. An input of the control circuit S is connected to a terminal for a test mode signal TM. By corresponding driving of the switches T1 and T2, the latter can be switched into a non-conducting state via the control circuit S on account of a test mode signal TM within an access cycle. This makes it possible for the bit lines BL1 and BL2 to be disconnected from the sense amplifier SA during an access cycle on account of an active state of the test mode signal TM. As a result, it is possible, in particular, to measure the leakage behavior of the relevant bit line without the influence of the sense amplifier.

In a test method of this type, one of the memory cells MC1 or MC2 is selected for reading out the respective stored data signal by activation of the respective word line WL1 or WL2. By way of example, the data signal of the memory cell MC1 is read out and the potential developed on the bit line BL1 is evaluated and amplified by the sense amplifier SA. In this state, the switch T1 is turned on. During the access cycle, the test mode signal TM is subsequently activated, so that the switch T1 is switched into the non-conducting state on account of the driving by the control circuit S. As a result, the bit line BL1 is disconnected from the sense amplifier SA.

The bit line BL1 is no longer driven in this case. If a leakage mechanism is present, then the potential state on the bit line BL1 will be altered after the disconnection. The potential state developing on the bit line BL1 is written back to the memory cell MC1. After a time that is fixedly set or can be defined externally, for example by way of the test mode signal TM, the word line WL1 is deactivated. Afterward, the memory cell MC1 is selected again and the written-back potential state stored in the memory cell MC1 is evaluated by the sense amplifier SA. In this case, the switch T1 is back in its conducting state. The evaluation of the written-back potential state can be used to make a statement about a leakage mechanism that is present.

In order also to be able to measure potential states of the bit lines BL1 and BL2, which assume comparatively small values, it is advantageous to correspondingly alter a reference potential Vref of the sense amplifier SA.

FIG. 2 illustrates a second embodiment of the memory according to the invention, whose memory cell array 2 is subdivided into two segments SEG1 and SEG2. The bit lines BL1 and BL2 in each case run in both segments SEG1, SEG2. The bit line BL1 thus has the bit line halves BL11 and BL21 and the bit line BL2 has the bit line halves BL12 and BL22. The sense amplifier SA is disposed between the two segments SEG1 and SEG2 and is connected to the bit line halves of the respective bit line. As a result, the two segments SEG1 and SEG2 are in each case assigned a common sense amplifier SA.

The bit line halves BL11 to BL22 can be connected to the sense amplifier SA via switches T11 to T22. The switches T11 to T22 are driven by the control circuit S. Respective first inputs of the control circuit S are connected to the test mode signal TM. Respective second inputs of the control circuit S are connected to a word line decoder DEC. The control circuit S has AND gates G1 and G2, respectively. The latter are in each case connected to a further logic circuit L1 and L2, respectively, which can generally be embodied in a simple manner.

In the deactivation state or precharge state, in which no memory cell access is carried out, the respective right-hand and left-hand bit line halves of the bit lines BL1, BL2 are connected to the sense amplifier SA. The switches T11 and T21 are put into the conducting state by the signals E1 and E2, derived from the word line address RADR. In the event of a memory cell access, for example to the memory cell MC11, the word line decoder DEC generates an activation signal WLA which selects the word line WL11. The bit line half BL11 remains connected to the sense amplifier SA. The other bit line half BL21 of the selected bit line BL1 is disconnected via the switch T21. This is controlled by a signal E2, which is derived from a word line address RADR. This ensures that only one bit line half, namely that of the selected segment SEG1, is connected to the sense amplifier SA. The test mode signal TM is in the inactive state at this point in time.

Through activation of the test mode signal TM, the bit line half BL11 can be disconnected from the sense amplifier SA after the evaluation of the data signal of the memory cell MC11. At this point in time, the bit line half BL11 is no longer driven, and the leakage behavior of the bit line half can be measured in the manner described above.

We claim:

1. An integrated memory, comprising:
    a sense amplifier;
    a terminal for a test mode signal;
    controllable switching devices connected to said sense amplifier and having control inputs;
    a memory cell array having memory cells, word lines connected to and selecting said memory cells, and bit lines connected to said memory cells for reading out or writing data signals to/from said memory cells, said bit lines connected to said controllable switching devices and, for reading out a data signal, said bit lines in each case can be coupled to said sense amplifier through one of said controllable switching devices; and
    a control circuit having an output connected to said control inputs of said controllable switching devices, said control circuit having an input connected to said terminal for the test mode signal, said control circuit configured in such a way that, within an access cycle, a respective switching device of said controllable switching devices can be switched into a non-conducting state on account of an active state of the test mode signal.

2. The integrated memory according to claim 1, wherein:
    said memory cell array is formed of memory segments;
    said bit lines in each case run in at least two mutually adjoining memory segments of said memory segments, each of said bits lines has bit line halves with one of said bit lines halves disposed in each of said two mutually adjoining memory segments; and
    said sense amplifier is disposed between said two mutually adjoining memory segments and is connected to said bit line halves through said controllable switching devices.

3. The integrated memory according to claim 2, wherein:
    in a deactivation state, said bit line halves are connected to said sense amplifier; and
    in an event of a memory cell access, a first of said bit line halves of a selected bit line is connected to said sense amplifier, and a second of said bit line halves of said selected bit line is disconnected from said sense amplifier; and
    one of said bit line halves of said selected bit line can be disconnected from said sense amplifier on account of the active state of the test mode signal.

4. The integrated memory according to claim 1, further comprising a decoder circuit receiving address signals for selecting one of said memory cells, said control circuit having a further input connected to said decoder circuit.

5. The integrated memory according to claim 4, wherein said decoder circuit is a word line decoder to which a word line address for selecting one of said word lines can be applied.

6. A method for testing an integrated memory, which comprises the steps of:
    selecting a respective memory cell for reading out a stored data signal by activating a word line;
    evaluating and amplifying the stored data signal read out on a selected bit line using a sense amplifier;
    subsequently activating a test mode signal for disconnecting the selected bit line from the sense amplifier;
    writing a potential state of the selected bit line back to the respective memory cell after a disconnection;
    selecting the respective memory cell again after the writing step; and
    evaluating the potential state written back to the respective memory cell in the sense amplifier.

7. The method according to claim 6, which comprises altering a reference potential of the sense amplifier for assisting in evaluating the potential state written back with a previously read-out stored data signal.

* * * * *